United States Patent
Meng

(10) Patent No.: US 12,352,828 B2
(45) Date of Patent: Jul. 8, 2025

(54) CHARGING TEST APPARATUS AND METHOD

(71) Applicant: HONOR DEVICE CO., LTD., Shenzhen (CN)

(72) Inventor: Longlong Meng, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/802,024

(22) PCT Filed: Jan. 18, 2022

(86) PCT No.: PCT/CN2022/072532
§ 371 (c)(1),
(2) Date: Dec. 8, 2022

(87) PCT Pub. No.: WO2022/252647
PCT Pub. Date: Dec. 8, 2022

(65) Prior Publication Data
US 2024/0219483 A1    Jul. 4, 2024

(30) Foreign Application Priority Data
May 31, 2021 (CN) .......................... 202110605094.5

(51) Int. Cl.
*G01R 31/66* (2020.01)
*G01R 1/04* (2006.01)
(Continued)

(52) U.S. Cl.
CPC ........... *G01R 31/66* (2020.01); *G01R 1/0416* (2013.01); *G01R 19/16538* (2013.01); *H02J 7/0036* (2013.01); *H02J 2207/30* (2020.01)

(58) Field of Classification Search
None
See application file for complete search history.

(56) References Cited

U.S. PATENT DOCUMENTS

| 6,461,309 B1 | 10/2002 | Smith |
| 6,803,766 B2 | 10/2004 | Kobayashi et al. |

(Continued)

FOREIGN PATENT DOCUMENTS

| CN | 104345240 A | 2/2015 |
| CN | 204215023 U | 3/2015 |

(Continued)

OTHER PUBLICATIONS

Zeng et al. ; Terminal Charging Parameter Testing Line; Date Published Mar. 18, 2015; Beiging Xiaomi Technology Co; CN 204215023 U; (Year: 2015).*

*Primary Examiner* — Nasima Monsur
(74) *Attorney, Agent, or Firm* — Fish & Richardson P.C.

(57) ABSTRACT

An embodiment of this application provides a charging test apparatus and method, where the charging test apparatus includes: a first USB interface, a second USB interface matching the first USB interface, a plurality of conductive paths, and a control module, where the first USB interface is configured to connect to an electronic device, and the second USB interface is configured to connect to a charger. The control module is separately electrically connected to each conductive path, and is configured to control connection and disconnection of each conductive path based on a preset on/off time parameter, where the preset on/off time parameter is used to determine a connection start moment of each conductive path. The charging test apparatus provided in this application can improve efficiency of a charging test.

14 Claims, 10 Drawing Sheets

(51) Int. Cl.
*G01R 19/165* (2006.01)
*H02J 7/00* (2006.01)

(56) References Cited

U.S. PATENT DOCUMENTS

| | | | |
|---|---|---|---|
| 9,477,288 B2 * | 10/2016 | Yang | G06F 1/3212 |
| 2005/0001592 A1 * | 1/2005 | Bayne | G06F 1/26 |
| | | | 320/132 |
| 2009/0027010 A1 * | 1/2009 | Ha | H02J 7/0044 |
| | | | 320/138 |
| 2015/0205337 A1 * | 7/2015 | Zhao | G06F 13/4068 |
| | | | 713/330 |
| 2018/0102663 A1 * | 4/2018 | Jung | H02J 7/04 |
| 2020/0278945 A1 * | 9/2020 | Li | G06F 1/28 |

FOREIGN PATENT DOCUMENTS

| | | |
|---|---|---|
| CN | 105022468 A | 11/2015 |
| CN | 107543994 A | 1/2018 |
| CN | 105846263 B | 2/2018 |
| CN | 208547675 U | 2/2019 |
| CN | 110300318 A | 10/2019 |
| CN | 110912224 A | 3/2020 |
| CN | 111220827 A | 6/2020 |
| CN | 111404232 A | 7/2020 |
| CN | 111431233 A | 7/2020 |
| CN | 111917163 A | 11/2020 |
| CN | 111934416 A | 11/2020 |
| CN | 112060942 A | 12/2020 |
| CN | 212568999 U | 2/2021 |
| CN | 112817892 A | 5/2021 |
| CN | 113267736 A | 8/2021 |
| JP | S6047878 A | 3/1985 |
| JP | H07153536 A | 6/1995 |
| JP | 2002357624 A | 12/2002 |
| JP | 2003272771 A | 9/2003 |
| JP | 2014182705 A | 9/2014 |

* cited by examiner

CHARGING TEST APPARATUS AND METHOD

CROSS-REFERENCE TO RELATED APPLICATIONS

This application is a National Stage of International Application No. PCT/CN2022/072532, filed Jan. 18, 2022, which claims priority to Chinese Patent Application No. 202110605094.5, filed May 31, 2021, both of which are hereby incorporated by reference in their entireties.

TECHNICAL FIELD

This application relates to the field of electronic technologies, and in particular, to a charging test apparatus and method.

BACKGROUND

With the advancement of technologies, portable electronic devices can be seen everywhere, such as mobile phones, tablet computers (Portable android device, Pad), or wearable devices. Portable electronic devices need to be charged by using a charger. Currently, most portable electronic devices are connected to a charger through a universal serial bus (Universal Serial Bus, USB) interface for charging.

However, when there is a problem with a charging function of an electronic device or a charger, some special plugging and unplugging behaviors (for example, a USB interface of the charger is quickly plugged into a USB interface of the electronic device (referred to as quick plugging and unplugging), and a USB interface of the charger is slowly plugged into a USB interface of the electronic device (referred to as slow plugging and unplugging)) may cause abnormal charging. Therefore, charging tests under various plugging and unplugging behaviors need to be performed on the electronic device before the electronic device is delivered or repaired.

In the related art, charging tests of electronic devices under various plugging and unplugging behaviors are manually performed, and consequently, test efficiency is low.

SUMMARY

This application provides a charging test apparatus and method, so as to improve efficiency of a charging test.

According to a first aspect, this application provides a charging test apparatus, including: a first USB interface, a second USB interface matching the first USB interface, a plurality of conductive paths, and a control module, where the first USB interface is configured to connect to an electronic device, and the second USB interface is configured to connect to a charger; the first USB interface includes a plurality of first pins, the second USB interface includes a plurality of second pins, and the plurality of first pins and the plurality of second pins match each other one by one to form a plurality of pin pairs; a plurality of conductive paths are electrically connected to the plurality of pin pairs in a one-to-one correspondence; and the control module is separately electrically connected to each conductive path, and is configured to control connection and disconnection of each conductive path based on a preset on/off time parameter, where the preset on/off time parameter is used to determine a connection start moment of each conductive path.

According to the charging test apparatus provided in the first aspect, the control module can control, based on the preset on/off time parameter, connection and disconnection of each conductive path, so as to simulate various plugging and unplugging behaviors between an electronic device and a charger, thereby facilitating test of a charging function of the electronic device. The charging test apparatus does not require the plugging and unplugging behaviors to be manually performed, thereby improving efficiency of the charging test. In addition, when the charging test apparatus simulates various plugging and unplugging behaviors, the control module controls connection and disconnection of the conductive path based on the preset on/off time parameter, so that test parameters and test results can be quantified, and the plugging and unplugging behaviors can be more objectively and truly simulated when compared with manually performing the plugging and unplugging behaviors, thereby making the test results more accurate.

In a possible implementation, connection start moments of the plurality of conductive paths are different. The control module controls, based on the preset on/off time parameter, connection and disconnection of each conductive path, so that the connection start moments of all the conductive paths are different, and different plugging and unplugging behaviors can be simulated.

In a possible implementation, a switch is electrically connected to each conductive path, and the switch is electrically connected to the control module; and the control module is specifically configured to control turn-on/turn-off of each switch based on a preset on/off time parameter, so as to control connection and disconnection of each conductive path.

In this implementation, the control module controls connection and disconnection of each conductive path by controlling the switch. A circuit connection manner is simple and easy to implement. In addition, the switch has little impact on a current and a voltage in the conductive path, so that various plug and unplug behaviors are simulated more truly, and a charging test result is more accurate.

Optionally, the switch may be an electronic switch. The electronic switch can further reduce impact on the current and the voltage in the conductive path, and further improve authenticity of simulation of plugging and unplugging behaviors, thereby further improving accuracy of the charging test.

In a possible implementation, the apparatus further includes a detection module, where the detection module is electrically connected to the control module, so as to detect a charging parameter between the first USB interface and the second USB interface; and the control module is further configured to determine, based on the charging parameter, whether a charging function of the electronic device is normal.

In this implementation, the detection module detects a charging parameter, and the control module determines, based on the charging parameter, whether the charging function of the electronic device is normal, and further implements automatic charging function test without manually performing the charging function test, thereby further improving efficiency of the charging test.

In a possible implementation, the charging parameter includes a charging current and/or a charging voltage, and the control module is specifically configured to: compare a charging current with a preset standard current, and compare a charging voltage with a preset standard voltage; and if a difference between the charging current and the preset standard current is less than a preset current difference threshold, and a difference between the charging voltage and the preset standard voltage is less than a preset voltage difference threshold, determine that the charging function is normal.

In this implementation, whether the charging function is normal is determined based on the charging current and/or the charging voltage, and the determining method is simple, easy to implement, and less prone to errors.

In a possible implementation, the plurality of first pins include a first power supply pin, the plurality of second pins include a second power supply pin, and the detection module is electrically connected to a conductive path corresponding to the first power supply pin; and the detection module is specifically configured to detect a current flowing through the power supply conductive path to obtain a charging current, and detect a voltage in the power supply conductive path to obtain a charging voltage.

In this implementation, the detection module is connected to the power supply conductive path, and the charging current and the charging voltage can be directly and accurately detected.

In a possible implementation, the detection module includes: a voltage detection circuit, where the voltage detection circuit is electrically connected to both the power supply conductive path and the control module, and is configured to detect a voltage in the power supply conductive path to obtain the charging voltage; and a current detection circuit, where the current detection circuit is electrically connected to both the power supply conductive path and the control module, and is configured to detect a current flowing through the power supply conductive path to obtain the charging current.

In a possible implementation, the current detection circuit includes: a first detection resistor, where the first detection resistor is connected in series in a power supply conductive path; a voltage detection unit, where the voltage detection unit is connected in parallel to both ends of the first detection resistor, and is configured to detect a voltage at both ends of the first detection resistor; and a calculation unit, where the calculation unit is electrically connected to both the voltage detection unit and the control module, and is configured to calculate a charging current based on the voltage at both ends of the first detection resistor and a resistance value of the first detection resistor.

In this implementation, the charging current detection method is simple and easy to implement.

In a possible implementation, the resistance value of the first detection resistor is less than 100 mohms.

In this implementation, the resistance value of the first detection resistor is less than 100 mohms, so that an effect of the first detection resistor on a current and a voltage in a power supply conductive path can be effectively controlled, thereby improving accuracy of charging current detection and charging voltage detection.

In a possible implementation, the detection module includes: a second detection resistor, where the second detection resistor is connected in series in the power supply conductive path;
an analog-to-digital converter, where the analog-to-digital converter is electrically connected to the power supply conductive path and connected to both ends of the second detection resistor, and is configured to collect a first analog voltage signal in the power supply conductive path, and convert the first analog voltage signal into a first digital voltage signal, so as to obtain the charging voltage; the analog-to-digital converter is further configured to collect a second analog voltage signal at both ends of the second detection resistor, and convert the second analog voltage signal into a second digital voltage signal, so as to obtain a second voltage; and the control module is further configured to calculate the charging current based on the second voltage and a resistance value of the second detection resistor.

In this implementation, in this embodiment, the analog-to-digital converter can not only implement the charging voltage detection function, but also implement the charging current detection function in cooperation with the first detection resistor and the control module, thereby implementing functional reuse of the analog-to-digital converter, simplifying the structure of the charging test apparatus, and effectively saving costs of the apparatus. In addition, the charging current is calculated by using the control module, thereby implementing functional reuse of the control module, further simplifying the structure of the charging test apparatus, and effectively saving the costs of the apparatus.

In a possible implementation, the resistance value of the second detection resistor is less than 100 mohms.

In this implementation, the resistance value of the second detection resistor is less than 100 mohms, so that an effect of the second detection resistor on a current and a voltage in a power supply conductive path can be effectively controlled, thereby improving accuracy of charging current detection and charging voltage detection.

In a possible implementation, the apparatus includes a plurality of groups of interface modules, and each group of interface modules includes the first USB interface, the second USB interface, and the plurality of conductive paths; and the plurality of conductive paths in each group of interface modules are electrically connected to the control module, and the control module is configured to control connection and disconnection of the plurality of conductive paths in each group of interface modules.

Optionally, the charging test apparatus includes a USB interface group in a plurality of groups of interface modules, so that simulation of charging plugging and unplugging behaviors between a plurality of groups of electronic devices and matching chargers can be implemented, thereby implementing test of charging functions of the plurality of electronic devices, improving test efficiency, and saving costs.

In a possible implementation, the apparatus includes a plurality of USB interface groups, and each USB interface group includes the first USB interface and the second USB interface; and the plurality of pin pairs in each USB interface group are electrically connected to the plurality of conductive paths in a one-to-one correspondence.

Optionally, interface types of the plurality of USB interface groups are different. The plurality of USB interface groups of different interface types are set, so that the charging test apparatus can be compatible with electronic devices and chargers with different interface types, thereby improving use flexibility.

According to a second aspect, this application provides a charging test method, applied to a charging test apparatus, where the charging test apparatus includes a first USB interface, a second USB interface matching the first USB interface, and a plurality of conductive paths, the first USB interface is configured to connect to an electronic device, the first USB interface includes a plurality of first pins, the second USB interface is configured to connect to a charger, the second USB interface includes a plurality of second pins, the plurality of first pins and the plurality of second pins match each other one by one to form a plurality of pin pairs, and the plurality of conductive paths are electrically connected to the plurality of pin pairs in a one-to-one correspondence; and the method includes: obtaining a preset on/off time parameter, where the preset on/off time parameter is used to determine a connection start moment of each conductive path; and controlling, based on the preset on/off time parameter, connection and disconnection of each conductive path.

According to the charging test method provided in the second aspect, the preset on/off time parameter is obtained, and connection and disconnection of each conductive path are controlled based on the preset on/off time parameter, so that various plugging and unplugging behaviors between the electronic device and the charger can be simulated, and a charging function of the electronic device can be tested. In the charging test method, the plugging and unplugging behaviors do not need to be manually performed, thereby improving efficiency of the charging test. In addition, in the charging test method, when various plugging and unplugging behaviors are simulated, connection and disconnection of the conductive path are controlled based on the preset on/off time parameter, so that test parameters and test results can be quantified, and the plugging and unplugging behaviors can be more objectively and truly simulated when compared with manually performing the plugging and unplugging behaviors, thereby making the test results more accurate.

In a possible implementation, the preset on/off time parameter includes a plurality of time parameter groups, each time parameter group includes time parameters of a plurality of conductive paths, and the time parameters are used to determine connection start moments of the conductive paths.

In this implementation, a plurality of connection moment parameter groups are set, so that a plurality of conductive paths can be connected based on different connection sequences and/or different connection time differences, so as to simulate a plurality of different plugging and unplugging behaviors, thereby implementing test of the charging function of the electronic device under the plurality of plugging and unplugging behaviors, and improving comprehensiveness of the test.

In a possible implementation, a switch is electrically connected to each conductive path; and the controlling, based on the preset on/off time parameter, connection and disconnection of each conductive path includes: generating a time sequence control signal for each switch based on a plurality of time parameter groups; and sending the time sequence control signal to a corresponding switch to control turn-on/turn-off of each switch, so as to control connection of all the conductive paths at different connection start moments.

In this implementation, a time sequence control signal for each switch is generated based on a plurality of time parameter groups, and connection of each switch can be accurately controlled by using the time sequence control signal, thereby improving accuracy of simulation of the plugging and unplugging behaviors, and further improving accuracy of the charging test.

In a possible implementation, the charging test apparatus further includes a detection module, and the detection module is configured to detect a charging parameter between the first USB interface and the second USB interface; and the method further includes: determining, based on the charging parameter, whether the charging function of the electronic device is normal.

In a possible implementation, the charging parameter includes a charging current and/or a charging voltage, and the determining, based on the charging parameter, whether the charging function of the electronic device is normal includes: comparing a charging current with a preset standard current, and comparing a charging voltage with a preset standard voltage; and if a difference between the charging current and the preset standard current is less than a preset current difference threshold, and a difference between the charging voltage and the preset standard voltage is less than a preset voltage difference threshold, determining that the charging function is normal.

In this implementation, whether the charging function is normal is determined based on the charging current and the charging voltage, and the determining method is simple, easy to implement, and less prone to errors.

In a possible implementation, the method further includes: if the charging function is abnormal, recording a connection start moment of each conductive path.

In this implementation, when the charging function is abnormal, the connection start moment of each conductive path is recorded, so that plugging and unplugging behaviors corresponding to the abnormal charging function are subsequently analyzed based on the connection start moment, so as to facilitate analysis of a cause of the abnormal charging function of the electronic device.

DESCRIPTION OF EMBODIMENTS

The following describes technical solutions in embodiments of this application with reference to accompanying drawings in the embodiments of this application. In the descriptions of the embodiments of this application, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, in the descriptions of the embodiments of this application, "a plurality of" means two or more than two.

The terms "first", "second", and "third" are used herein for description only, and cannot be understood as indicating or implying relative importance or implicitly indicating the quantity of indicated technical features. Therefore, the features defined with "first", "second", and "third" can explicitly or implicitly include one or more of the features.

The charging test apparatus and method provided in the embodiments of this application can be used to test a charging function of an electronic device under various plugging and unplugging behaviors. The electronic device may be a device whose charging interface is a USB interface, such as a mobile phone, a tablet computer, a wearable device, an in-vehicle device, an augmented reality (augmented reality, AR)/virtual reality (virtual reality, VR) device, a notebook computer, a ultra-mobile personal computer (ultra-mobile personal computer, UMPC), a netbook, and a personal digital assistant (personal digital assistant, PDA). A specific type of the electronic device is not limited in this embodiment of this application.

The electronic device is connected to a charger by using a USB interface for charging. Depending on protocol standard versions, USB interfaces are classified into a USB 1.0 interface, a USB 2.0 interface, and a USB 3.0 interface. In addition, as a connector, a USB interface includes a USB plug (Plug) and a USB receptacle (Receptacle). Depending on the appearance and pin setting of the interface, the USB interfaces are classified into a Type-A USB interface (Type-A), a Type-B (Type-B) USB interface, a Type-C (Type-C) USB interface, a Mini (Mini) USB interface, and a Micro (Micro) USB interface. However, any type of USB interface includes at least four pins: a power (VCC) pin, a data line negative (D−) pin, a data line positive (D+) pin, and a ground (GND) pin. The VCC pin is also referred to as a VCC+ pin or a VBUS pin. The VCC pin and the ground GND pin are used to transmit charging voltage signals. The D− pin and the D+ pin are used to transmit charging data signals, including charging protocol data and the like.

Figure 1:
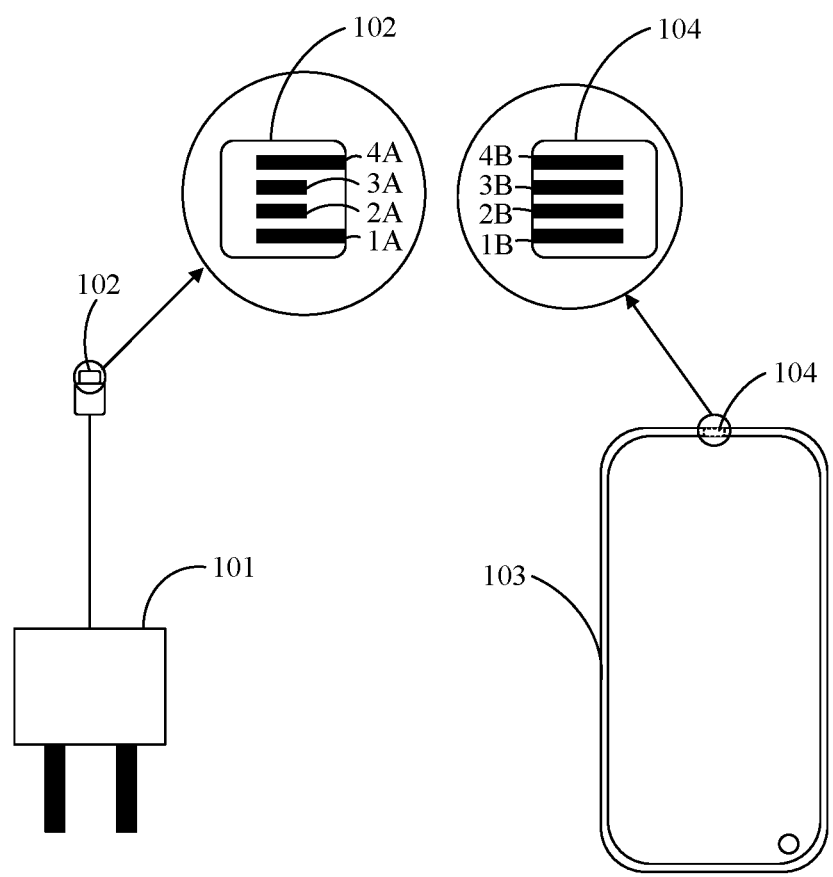
FIG. 1 is a schematic diagram of a structure of a USB interface of a charger and a structure of a USB interface of an electronic device according to an embodiment of this application.

For example, using a Type-A USB 2.0 interface as an example, FIG. 1 is a schematic diagram of a structure of a USB interface of a charger and a USB interface of an electronic device. As shown in FIG. 1, the USB interface 102 of the charger 101 is a USB plug. For ease of description, the USB interface 102 may be referred to as a USB plug 102. The USB interface 104 of the electronic device 103 is a USB receptacle. For ease of description, the USB interface 104 may be referred to as a USB receptacle 104. The USB plug 102 includes a VCC pin 1A, a D− pin 2A, a D+ pin 3A, and a GND pin 4A. The USB receptacle 104 includes a VCC pin 1B, a D− pin 2B, a D+ pin 3B, and a GND pin 4B.

When in use, the pins in the USB plug 102 are connected to the pins the USB receptacle 104 in a one-to-one correspondence. For ease of description, two pins that match each other are defined as a pin pair. For example, the VCC pin 1A and the VCC pin 1B are a pin pair. In the following descriptions, a pin pair formed by the VCC pin in the plug and the VCC pin in the receptacle is referred to as a VCC pin pair, a pin pair formed by the D− pin in the plug and the D− pin in the receptacle is referred to as a D− pin pair, a pin pair formed by the D+ pin in the plug and the D+ pin in the receptacle is referred to as a D+ pin pair, and a pin pair formed by the GND pin in the plug and the GND pin in the receptacle is referred to as a GND pin pair.

When the USB plug 102 is inserted into the USB receptacle 104, each pin pair is connected. Specifically, the VCC pin 1A is connected to the VCC pin 1B, the D− pin 2A is connected to the D− pin 2B, the D+ pin 3A is connected to the D+ pin 3B, and the GND pin 4A is connected to the GND pin 4B. The electronic device 103 determines whether the charger 101 is in a charging state by detecting information such as currents or voltages on the four pin pairs, and identifies a type of the charger (for example, identifies whether the charger is a standard charger), so as to control charging based on the type of the charger. Ideally, the charger 101 should charge the electronic device 103 based on a rated voltage and a rated current, regardless of the plugging and unplugging behaviors, provided that each pin pair is connected.

However, in actual application, it is found that when a charging function of the electronic device 103 and/or a charging function of the charger 101 are/is abnormal, under some special plugging and unplugging behaviors (for example, quick plugging and unplugging, slow plugging and unplugging, and oblique plugging and unplugging), even if all the pin pairs are connected, it is still possible that the electronic device 103 cannot correctly identify the charger 101, or the electronic device 103 incorrectly identify the type of the charger 101, and consequently, the charger 101 cannot charge the electronic device 103 normally, and the charging fails or the charging is slow.

Therefore, before an electronic device whose charging interface is a USB interface is delivered or when the electronic device is returned to a factory for maintenance, a charging function test under various plugging and unplugging behaviors usually needs to be tested, so as to ensure that the charging function of the electronic device is normal in various plugging and unplugging scenarios. The plugging and unplugging behaviors include, but are not limited to, quick plugging and unplugging, slow plugging and unplugging, and oblique plugging and unplugging. In the related art, the plugging and unplugging behaviors in the charging test process are manually performed. Not only the test efficiency is low, but also quickness, slowness, and inclination cannot be measured in the test process; and many subjective factors affect the test. Therefore, the test cannot be performed objectively and quantitatively. As a result, the test result is not accurate enough. This application aims to provide a charging test apparatus and method that have a high test efficiency, can be used to objectively and quantitatively perform a test, and can deliver an accurate test result.

The inventors have found through research that different plugging and unplugging behaviors such as quick plugging and unplugging, slow plugging and unplugging, and oblique plugging and unplugging are actually caused by different connection sequences of the pin pairs of the USB plug 102 and the pin pairs of the USB receptacle 104, and/or different connection time differences of the pin pairs. In other words, during the charging test, the test result is actually affected by the connection time sequence of each pin pair.

For example, in actual use, when an old man slowly inserts the USB plug 102 into the USB receptacle 104, it is possible that the pin pair formed by the VCC pin 1A and the VCC pin 1B, and the pin pair formed by the GND pin 4A and the GND pin 4B are connected at the same time, and after about 1 s (second), the pin pair formed by the D− pin 2A and the D− pin 2B, and the pin pair formed by the D+ pin 3A and the D+ pin 3B are connected at the same time. That is, the VCC pin pair and the GND pin pair are first connected, then the D− pin pair and the D+ pin pair are connected, and a time difference between the connection moment of the VCC pin pair and the GND pin pair and the connection moment of the D− pin pair and the D+ pin pair is 1 s.

However, when a young man quickly inserts the USB plug 102 into the USB receptacle 104, it is possible that pin pair formed by the VCC pin 1A and the VCC pin 1B and the pin pair formed by the GND pin 4A and the GND pin 4B are connected at the same time, and after about 0.5 s, the pin pair formed by the D− pin 2A and the D− pin 2B and the pin pair formed by the D+ pin 3A and the D+ pin 3B are connected at the same time. That is, the VCC pin pair and the GND pin pair are first connected, then the D− pin pair and the D+ pin pair are connected, and a time difference between the connection moment of the VCC pin pair and the GND pin pair and the connection moment of the D− pin pair and the D+ pin pair is 0.5 s.

For another example, in actual use, if the USB plug 102 is obliquely inserted into the USB receptacle 104, there is a certain angle between a longitudinal section of the USB plug 102 and a longitudinal section of the USB receptacle 104, so that the VCC pin 1A and the VCC pin 1B are first in contact with each other for connection; after 0.1 s, the GND pin 4A and the GND pin 4B are in contact with each other for connection; after 0.2 s, the D− pin 2A and the D− pin 2B are in contact with each other for connection; and after 0.1 s, the D+ pin 3A and the D+ pin 3B are in contact with each other for connection. That is, the connection sequence of the four pin pairs is as follows: The VCC pin pair is connected first, then the GND pin pair is connected, then the D− pin pair is connected, and finally the D+ pin pair is connected. A time difference between the connection moment of the VCC pin pair and the connection moment of the GND pin pair is 0.1 s; a time difference between the connection moment of the D pin pair and the connection moment of the GND pin pair is 0.2 s; and a time difference between the connection moment of the D+ pin pair and the connection moment of the D pin pair is 0.1 s.

It can be understood that, in different plugging and unplugging behaviors or plugging and unplugging actions, connection time sequences of the pin pairs may be different.

It should be noted that the foregoing description is merely an example analysis, and does not impose any limitation on a meaning of plugging and unplugging behaviors. In addition, the plugging and unplugging behaviors described in this embodiment of this application may further include any plugging and unplugging behaviors that may cause different connection sequences and connection time differences in addition to quick plugging and unplugging, slow plugging and unplugging, and oblique plugging and unplugging behaviors. This is not limited in this application.

For ease of understanding, the following describes in detail the charging test apparatus and method provided in the embodiments of this application based on the application scenario in FIG. 1 with reference to the embodiments and the accompanying drawings.

Figure 2:
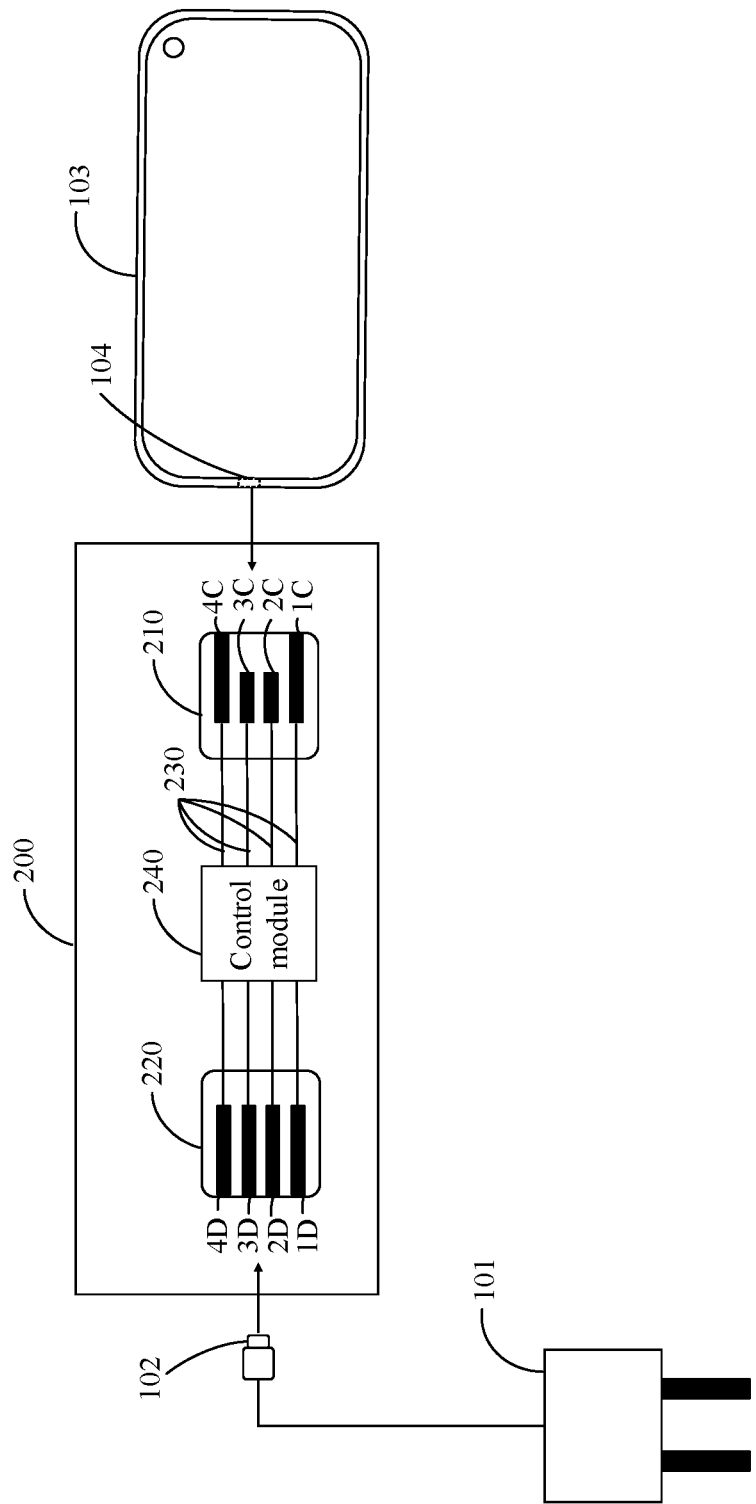
FIG. 2 is a schematic diagram of a structure of a charging test apparatus according to an embodiment of this application.

FIG. 2 is a schematic diagram of a structure and an application of a charging test apparatus according to an embodiment of this application. As shown in FIG. 2, the charging test apparatus 200 includes a first USB interface 210, a second USB interface 220, a plurality of conductive paths 230, and a control module 240.

The first USB interface 210 matches the USB interface 104 of the electronic device 103, and is configured to connect to the electronic device 103. The second USB interface 220 matches the USB interface 102 of the charger 101, and is configured to connect to the charger 101.

The first USB interface 210 matches the second USB interface 220, that is, the first USB interface 210 and the second USB interface 220 are of a same type and can be plugged into each other. For example, if the first USB interface 210 is a USB plug compatible with Type-C USB 2.0, the second USB interface 220 is a USB receptacle compatible with Type-C USB 2.0.

Both the first USB interface 210 and the second USB interface 220 include a plurality of pins. A pin in the first USB interface 210 is defined as a first pin. A pin in the second USB interface 220 is defined as a second pin. A plurality of first pins in the first USB interface 210 one-to-one and a plurality of second pins in the second USB interface 220 match each other one by one to form a plurality of pin pairs. It can be understood that types of the first USB interface 210 and the second USB interface 220 are different, and quantities and pin definitions of the first pin and the second pin are different.

As shown in FIG. 2, using a Type-A USB 2.0 interface as an example, the plurality of first pins include: a first VCC pin 1C, a first D− pin 2C, a first D+ pin 3C, and a first GND pin 4C. The plurality of second pins include: a second VCC pin 1D, a second D− pin 2D, a second D+ pin 3D, and a second GND pin 4D. The first VCC pin 1C and the second VCC pin 1D form a VCC pin pair. The first D− pin 2C and the second D− pin 2D form a D− pin pair. The first D+ pin 3C and the second D+ pin 3D form a D+ pin pair. The first GND pin 4C and the second GND pin 4D form a GND pin pair.

The two pins in each pin pair are electrically connected by using one conductive path 230. The conductive path 230 refers to a line that can be connected for a current to pass through. Optionally, the conductive path 230 may be a wire, or may be a conductive line in a printed circuit board (Printed Circuit Board, PCB) or a flexible printed circuit (Flexible Printed Circuit, FPC). For ease of description, a conductive path 230 connected to the VCC pin pair is referred to as a VCC conductive path, a conductive path 230 connected to the D− pin pair is referred to as a D− conductive path, a conductive path 230 connected to the D+ pin pair is referred to as a D+ conductive path, and a conductive path 230 connected to the GND pin pair is referred to as a GND conductive path.

The control module 240) is electrically connected to each conductive path 230. The control module 240) is configured to control connection and disconnection of the conductive path 230. The control module 240 may be a hardware circuit, may be a software program functional module, or may be a combination of a hardware circuit and a software program. This is not limited in this embodiment of this application. Optionally, the control module 240 may be a processor such as a central processing unit, a microcontroller unit (Microcontroller Unit, MCU), or a programmable logic controller (Programmable Logic Controller, PLC). The processor executes a computer program to control connection and disconnection of the conductive path 230.

Specifically, the control module 240 may control, based on a preset on/off time parameter, connection and disconnection of each conductive path 230. The preset on/off time parameter refers to a preset time parameter. A connection start moment of each conductive path 230 can be directly or indirectly determined based on the preset on/off time parameter. A specific principle of controlling connection and disconnection of each conductive path 230 by the control module 240 based on the preset on/off time parameter will be described in detail in the following embodiments related to the charging test method.

Optionally, the control module 240 is specifically configured to control, based on the preset on/off time parameter, connection and disconnection of each conductive path 230, so that connection start moments of all the conductive paths 230 are different, and different plugging and unplugging behaviors can be simulated. For example, the control module 240 controls the VCC conductive path and the GND conductive path to be connected at the same time at a moment A, and controls the D− conductive path and the D+ conductive path to be connected 1 s after the moment A, so as to simulate quick plugging and unplugging, and further detect whether a charging function of the electronic device 103 is normal when quick plugging and unplugging are performed.

It can be understood that, in addition to the foregoing modules, the charging test apparatus 200 may further include more modules according to a requirement. For example, the charging test apparatus 200 may further include a power supply module, a storage module, or a timing module.

The following describes a use process and a test principle of the charging test apparatus 200.

As shown in FIG. 2, when in use, the first USB interface 210 is inserted into the USB receptacle 104 of the electronic device 103; and the USB plug 102 of the charger 101 is inserted into the second USB interface 220. Because a plurality of pin pairs that are formed by the first pins in the first USB interface 210 and the second pins in the second USB interface 220 are connected in a one-to-one correspondence by using a plurality of conductive paths 230, the USB receptacle 104 of the electronic device 103 is connected to each pin pair of the USB plug 102 of the charger 101. The control module 240 controls, based on the preset on/off time parameter, connection and disconnection of each conductive path 230, so as to simulate different plugging and unplugging behaviors, and may further determine whether a charging function of the electronic device 103 is normal in each plugging and unplugging behaviors, and determine whether an exception such as slow charging or a charging failure occurs.

The charging test apparatus provided in this embodiment includes a first USB interface, a second USB interface matching the first USB interface, a plurality of conductive paths, and a control module. The plurality of first pins of the first USB interface and the plurality of second pins of the second USB interface match each other one by one to form a plurality of pin pairs, the plurality of conductive paths are electrically connected to the plurality of pin pairs in a one-to-one correspondence, and the control module is electrically connected to each conductive path. In this embodiment, the control module can control, based on the preset on/off time parameter, connection and disconnection of each conductive path, so as to simulate various plugging and unplugging behaviors between an electronic device and a charger, thereby facilitating test of a charging function of the electronic device. The charging test apparatus provided in this embodiment does not require the plugging and unplugging behaviors to be manually performed, thereby improving efficiency of the charging test. In addition, when the charging test apparatus provided in this embodiment simulates various plugging and unplugging behaviors, the control module controls connection and disconnection of the conductive path based on the preset on/off time parameter, so that test parameters and test results can be quantified, and the plugging and unplugging behaviors can be more objectively and truly simulated when compared with manually performing the plugging and unplugging behaviors, thereby making the test results more accurate.

Figure 3:
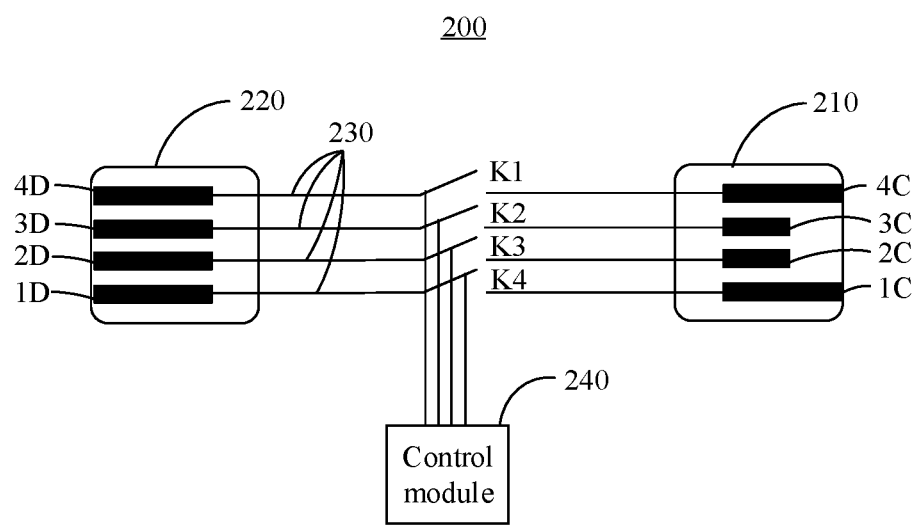
FIG. 3 is a schematic diagram of a structure of another charging test apparatus according to an embodiment of this application.

FIG. 3 is a schematic diagram of a structure of a charging test apparatus according to another embodiment. Optionally, a switch may be electrically connected to each conductive path 230. As shown in FIG. 3, a switch K1 is connected to a GND conductive path, a switch K2 is connected to a D+ conductive path, a switch K3 is connected to a D− conductive path, and a switch K4 is connected to a VCC conductive path. The control module 240 is electrically connected to each switch, and controls turn-on/turn-off of each switch, so as to control connection and disconnection of each conductive path 230. Specifically, when the control module 240) controls the switch to turn on, the conductive path 230 is connected; or when the control module 240 controls the switch to turn off, the conductive path 230 is disconnected. In this embodiment, the control module controls connection and disconnection of each conductive path by controlling the switch. A circuit connection manner is simple and easy to implement. In addition, the switch has little impact on a current and a voltage in the conductive path, so that various plug and unplug behaviors are simulated more truly, and a charging test result is more accurate.

In an optional implementation, the foregoing switch may be an electronic switch. The electronic switch can further reduce impact on the current and the voltage in the conductive path, and further improve authenticity of simulation of plugging and unplugging behaviors, thereby further improving accuracy of the charging test.

Figure 4:
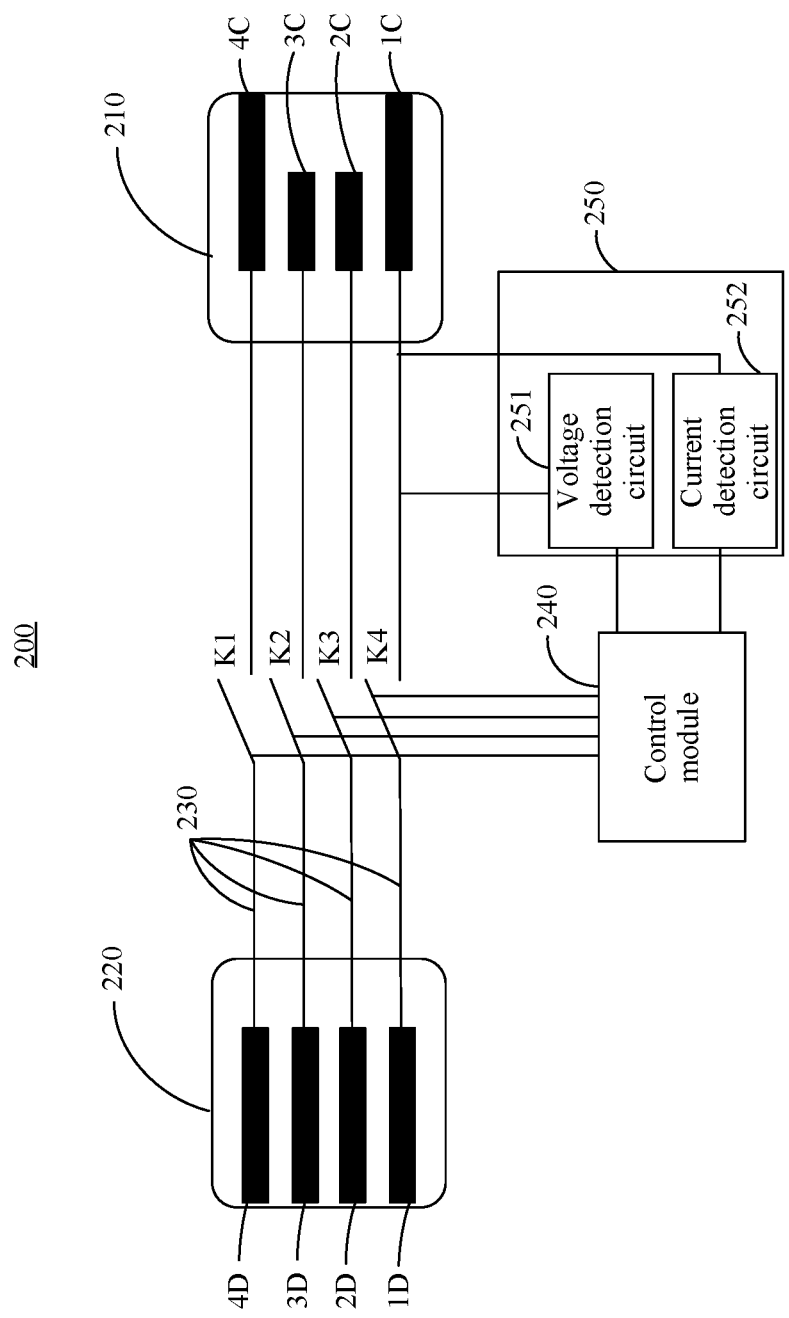
FIG. 4 is a schematic diagram of a structure of still another charging test apparatus according to an embodiment of this application.

FIG. 4 is a schematic diagram of a structure of a charging test apparatus according to still another embodiment. As shown in FIG. 4, the charging test apparatus 200 may further include a detection module 250. The detection module 250 is electrically connected to the control module 240. The detection module 250 is configured to detect a charging parameter between the first USB interface 210 and the second USB interface 220. The control module 240 is further configured to determine, based on the charging parameter obtained by the detection module 250, whether the charging function of the electronic device is normal.

Optionally, the charging parameter includes at least one of a charging current or a charging voltage. In this case, the control module 240 determines, based on at least one of the charging current or the charging voltage, whether the charging function of the electronic device is normal.

In an optional implementation, the control module 240 compares the charging current with a preset standard current, compares the charging voltage with a preset standard voltage, and determines, based on a comparison result, whether the charging function of the electronic device is normal. Optionally, the preset standard current may be a rated output current of the charger, and the preset standard voltage may be a rated output voltage of the charger. For example, if the charger outputs 5V and 2 A, the preset standard current may be 2 A, and the preset standard voltage may be 5V.

Specifically, the control module 240 may calculate a difference between the charging current and the preset standard current, and calculate a difference between the charging voltage and the preset standard voltage. If the difference between the charging current and the preset standard current is less than a preset current difference threshold, and the difference between the charging voltage and the preset standard voltage is less than a preset voltage difference threshold, it is determined that the charging function is normal; otherwise, it is determined that the charging function is abnormal.

Specifically, the detection module 250 may be connected to a VCC path, and detect a current and a voltage on the VCC path to obtain a charging current and a charging voltage.

The detection module 250 may have a plurality of implementations. The following describes a specific structure of the detection module 250.

In an optional implementation, as shown in FIG. 4, the detection module 250 may include a voltage detection circuit 251 and a current detection circuit 252. Both the voltage detection circuit 251 and the current detection circuit 252 are connected to a VCC path, and are electrically connected to the control module 240. Specifically, the voltage detection circuit 251 is configured to detect a voltage in the VCC path to obtain a charging voltage. The current detection circuit 252 is configured to detect a current flowing through the VCC path to obtain a charging current. A specific structure of the voltage detection circuit 251 and a specific structure of the current detection circuit 252 are not limited in this embodiment of this application, provided that functions of the voltage detection circuit 251 and the current detection circuit 252 can be implemented.

Optionally, the current detection circuit 252 may include a first detection resistor, a voltage detection unit, and a calculation unit. The first detection resistor may be connected in series in a VCC conductive path. The voltage detection unit is connected in parallel to both ends of the first detection resistor, and is configured to detect a voltage at both ends of the first detection resistor. The calculation unit is electrically connected to the voltage detection unit and the control module 240, and is configured to calculate the charging current based on the voltage at both ends of the first detection resistor and a resistance value of the first detection resistor. Specifically, the charging current=the voltage at both ends of the first detection resistor/the resistance value of the first detection resistor.

Optionally, the resistance value of the first detection resistor may be less than 100 mohms. For example, the resistance value of the first detection resistor may be 10 mohms. It can be understood that the smaller the resistance value of the first detection resistor, the less impact on the VCC conductive path, the more accurate the detected charging current and the detected charging voltage. Therefore, the resistance value of the first detection resistor is less than 100 mohms, so that an effect of the first detection resistor on a current and a voltage the a VCC conductive path can be effectively controlled, thereby improving accuracy of charging current detection and charging voltage detection.

Figure 5:
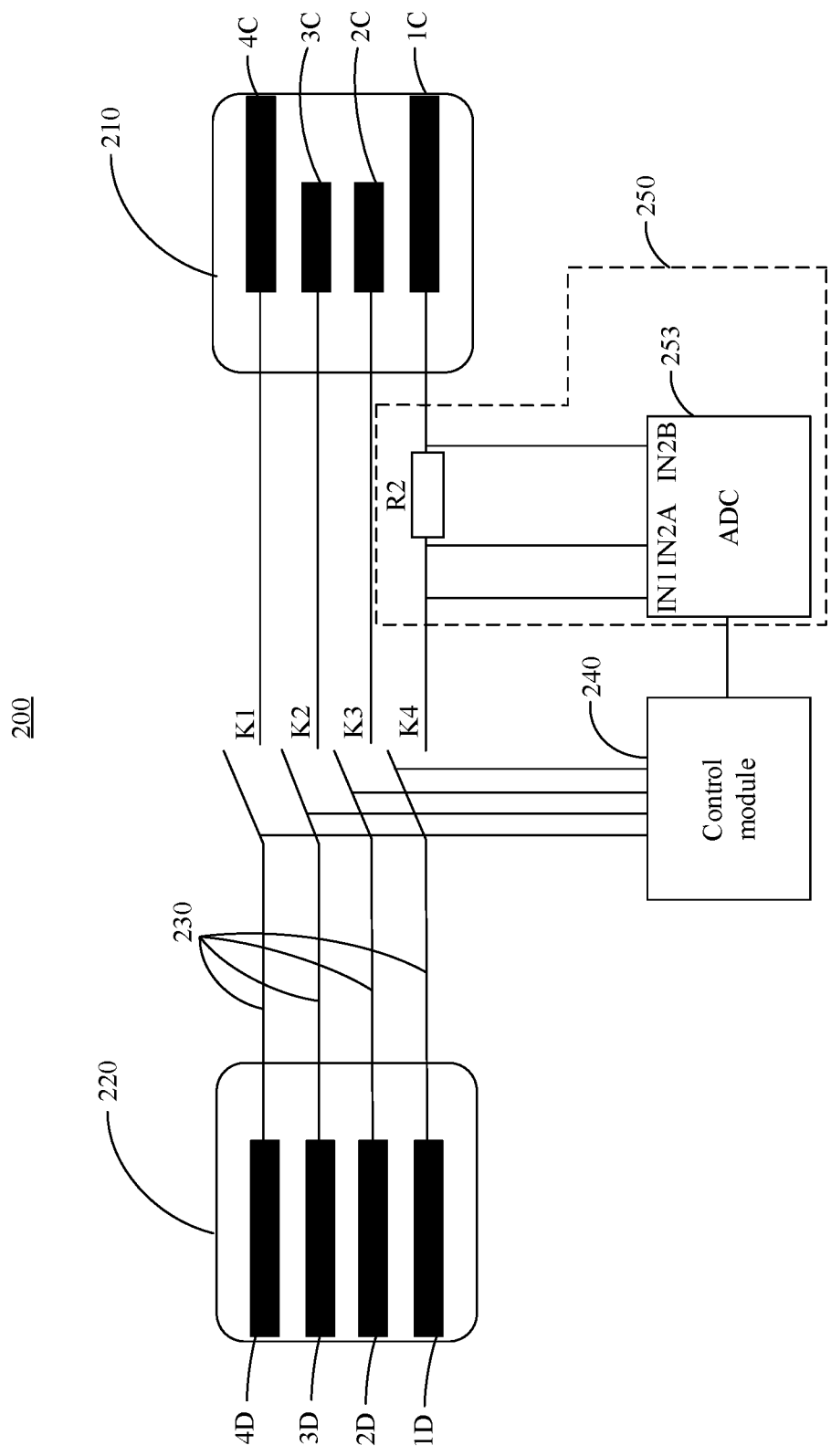
FIG. 5 is a schematic diagram of a structure of still another charging test apparatus according to an embodiment of this application.

In another optional implementation, for example, FIG. 5 is a schematic diagram of another structure of the charging test apparatus. In this embodiment, the charging test apparatus 200 detects a charging voltage and a charging current by using an implementation solution different from that in the embodiment shown in FIG. 4. As shown in FIG. 5, the detection module 250 may include a second detection resistor R2 and an analog-to-digital converter (Analog-to-Digital Converter, ADC) 253. The second detection resistor R2 is connected in series in a VCC conductive path. The ADC 253 may include a first group of input ends and a second group of input ends, where the first group of input ends includes one input port IN1, and the second group of input ends includes two input ports IN2A and IN2B. The input port IN1 of the first group of input ends is electrically connected to the VCC conductive path. The ADC 253 collects a first analog voltage signal in the VCC conductive path by using the input port IN1, and converts the first analog voltage signal into a first digital voltage signal, so as to obtain a charging voltage. The two input ports IN2A and IN2B of the second group of input ends are electrically connected to both ends of the second detection resistor R2. The ADC 253 collects a second analog voltage signal at both ends of the second detection resistor R2 by using the input ports IN2A and IN2B, and converts the second analog voltage signal into a second digital voltage signal, so as to obtain a second voltage. Optionally, the ADC 253 may collect the second analog voltage signal after performing differential amplification on the signals input by the input ports IN2A and IN2B.

An output end of the ADC 253 is electrically connected to the control module 240. The ADC 253 sends the charging voltage and the second voltage to the control module 240. The control module 240 calculates the charging current based on the second voltage and the resistance value of the second detection resistor R2, and then determines, based on the charging current and the charging voltage, whether the charging function of the electronic device is normal.

In this embodiment, the ADC can not only implement the charging voltage detection function, but also implement the charging current detection function in cooperation with the second detection resistor R2 and the control module, thereby implementing functional reuse of the ADC, simplifying the structure of the charging test apparatus, and effectively saving costs of the apparatus. In addition, the charging current is calculated by using the control module, thereby implementing functional reuse of the control module, further simplifying the structure of the charging test apparatus, and effectively saving the costs of the apparatus.

Similar to the principle of the first detection resistor, a resistance value of the second detection resistor R2 may also be less than 100 mohms, so that an effect of the second detection resistor R2 on a current and a voltage in a VCC conductive path can be effectively controlled, thereby improving accuracy of charging current detection and charging voltage detection.

In some embodiments, the charging test apparatus 200 provided in the foregoing embodiments may be further expanded to implement more functions. Optionally, there may be a plurality of first USB interfaces 210 and a plurality of second USB interfaces 220, so that a plurality of chargers and electronic devices can be connected at the same time. The following further describes several extended charging test apparatuses 200 with reference to the embodiments and accompanying drawings.

For ease of description, in the following embodiment, a first USB interface 210 and a second USB interface 220 matching the first USB interface 210 are collectively referred to as a USB interface group 201. Each USB interface group 201 and a plurality of conductive paths 230 connected to the USB interface group 201 are collectively referred to as an interface module 202. A VCC conductive path, a D− conductive path, a D+ conductive path, and a GND conductive path are collectively referred to as a group of conductive paths.

Figure 6:
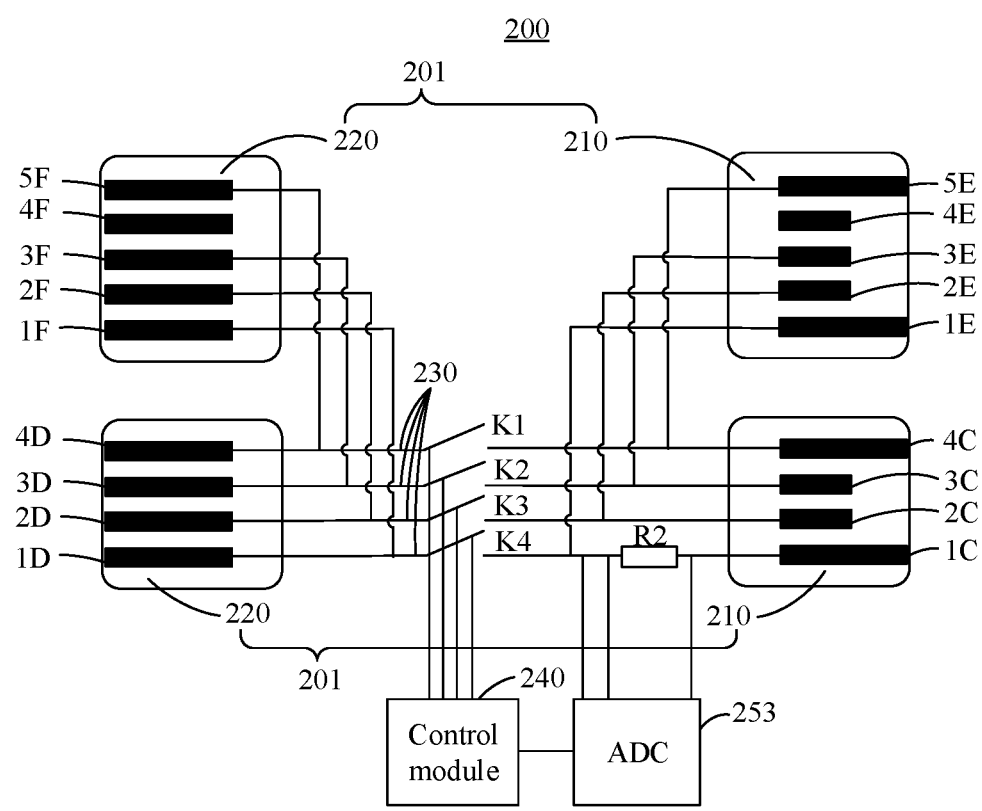
FIG. 6 is a schematic diagram of a structure of still another charging test apparatus according to an embodiment of this application.

For example, FIG. 6 is a schematic diagram of a structure of a charging test apparatus according to still another embodiment. As shown in FIG. 6, the charging test apparatus 200 may include a plurality of USB interface groups 201. Each USB interface group 201 includes a first USB interface 210 and a second USB interface 220 matching the first USB interface 210. The charging test apparatus 200 may include a group of conductive paths, and a plurality of pin pairs in each USB interface group 201 are electrically connected to the plurality of conductive paths 230 in the USB interface group in a one-to-one correspondence. In other words, a plurality of USB interface groups 201 share one group of conductive paths.

Optionally, interface types of the plurality of USB interface groups 201 may be different. For example, as shown in FIG. 6, the first USB interface 210 and the second USB interface 220 in the first USB interface group 201 in FIG. 6 may be Type-A USB 2.0 interfaces, and the first USB interface 210 and the second USB interface 220 in the second USB interface group 201 in FIG. 6 may be Mini USB 2.0 interfaces. Specifically, the first USB interface 210 in the first USB interface group 201 includes four pins 1C-4C, and the second USB interface 220 in the first USB interface group 201 includes four pins 1D-4D. The pins 1C-4C and the pins 1D-4D are electrically connected in a one-to-one correspondence by using four conductive paths 230. The first USB interface 210 in the second USB interface group 201 includes five pins 1E-5E, and the second USB interface 220 in the second USB interface group 201 includes five pins 1F-5F. The pin 4E in the pins 1E-5E is empty, and the pin 4F in the pins 1F-5F is empty. Other pins except 4E in the pins 1E-5E are electrically connected to other pins except 4F in the pins 1F-5F in a one-to-one correspondence by using four conductive paths 230.

In this implementation, the plurality of USB interface groups of different interface types are set, the charging test apparatus can be compatible with electronic devices and chargers with different interface types, thereby improving use flexibility.

Figure 7:
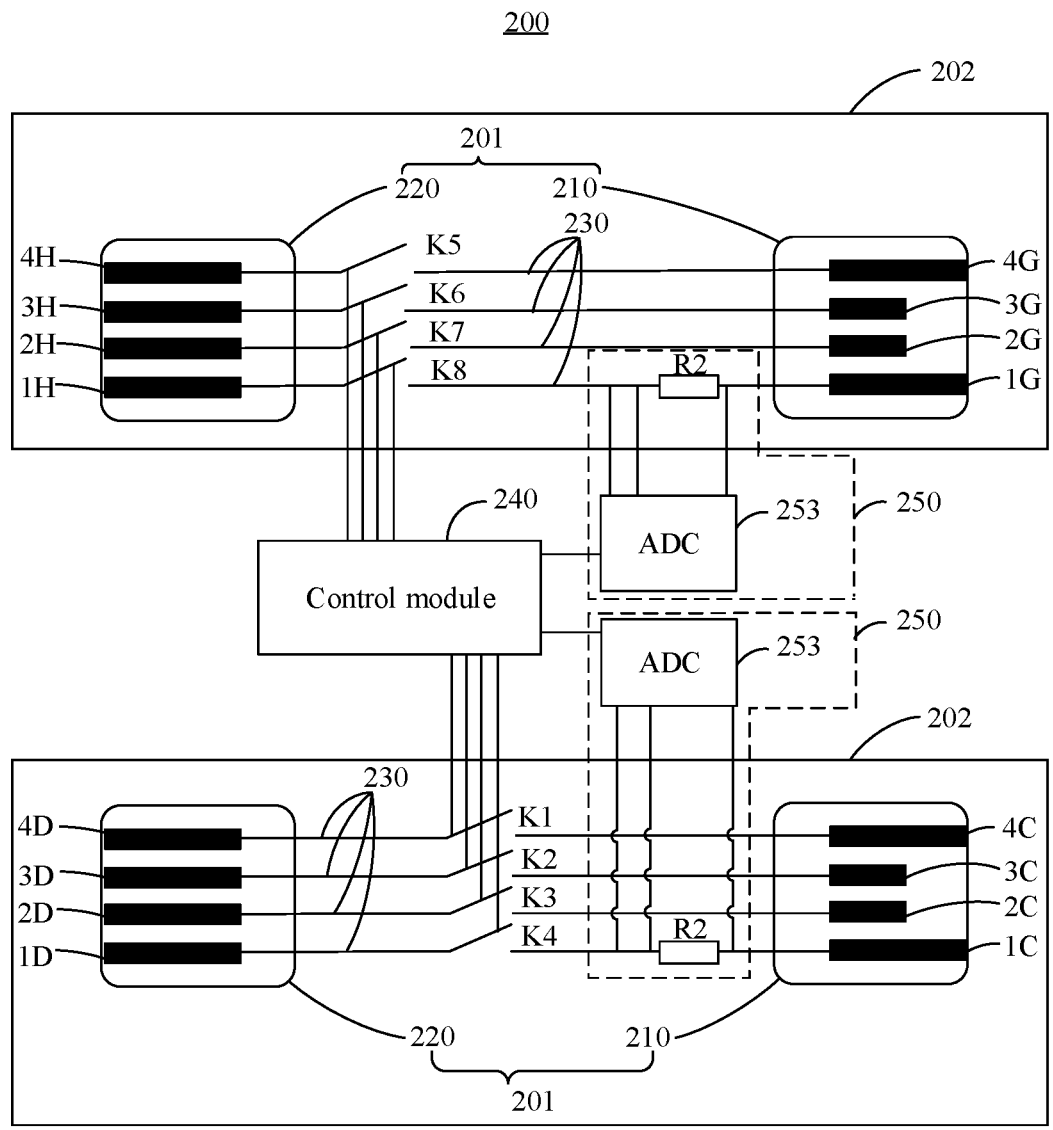
FIG. 7 is a schematic diagram of a structure of still another charging test apparatus according to an embodiment of this application.

For example, FIG. 7 is a schematic diagram of a structure of a charging test apparatus according to still another embodiment. As shown in FIG. 7, the charging test apparatus 200 may include a plurality of interface modules 202. Each interface module 202 includes a USB interface group 201 and a group of conductive paths connected to the USB interface group 201. The plurality of conductive paths 230 in each interface module 202 are electrically connected to the control module 240. The control module 240 is configured to control connection and disconnection of each conductive path 230 in each group of interface modules 202.

Optionally, in this embodiment, there may be a plurality of detection modules 250, and each detection module 250 is separately connected to a VCC conductive path in an interface module 202. In addition, each detection module 250 is connected to the control module 240. The control module 240 is further configured to obtain a charging current and a charging voltage between the first USB interface 210 and the second USB interface 220 in a corresponding interface module 202 by using each detection module 250, so as to determine whether the charging function of the electronic device connected to the interface module 202 is normal.

It can be understood that the USB interface groups 201 in the plurality of interface modules 202 may be the same or different. When the USB interface groups 201 in the plurality of interface modules 202 are the same, the charging test apparatus 200 can simulate charging and plugging behaviors between a plurality of groups of electronic devices with a same interface type and a matching charger, so that charging functions of the plurality of electronic devices can be tested, test efficiency can be improved, and costs can be saved.

When the USB interface groups 201 in the plurality of interface modules 202 are different, the charging test apparatus 200 can simulate charging and plugging behaviors between a plurality of groups of electronic devices with different interface types and a matching charger, thereby improving test efficiency, saving costs, and improving compatibility.

Figure 8:
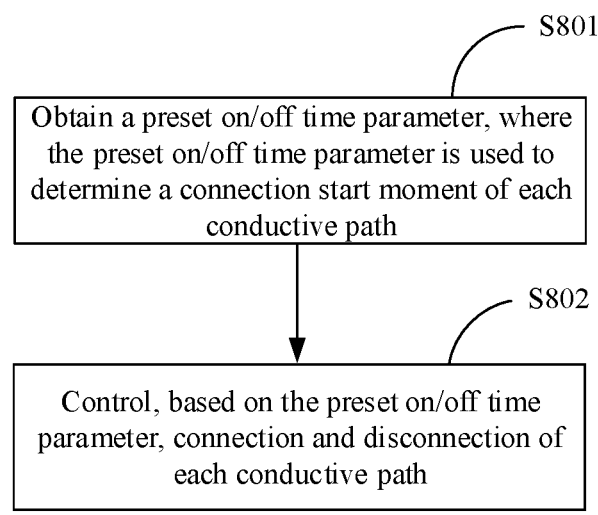
FIG. 8 is a schematic flowchart of a charging test method according to an embodiment of this application.

An embodiment of this application further provides a charging test method, and the method may be applied to the charging test apparatus in the foregoing embodiment. For example, FIG. 8 is a schematic flowchart of a charging test method according to an embodiment of this application. As shown in FIG. 8, the method includes:

S801. Obtain a preset on/off time parameter, where the preset on/off time parameter is used to determine a connection start moment of each conductive path.

S802. Control, based on the preset on/off time parameter, connection and disconnection of each conductive path.

The preset on/off time parameter may be set according to an actual use requirement. For example, a matching preset on/off time may be set based on to-be-simulated charging and plugging behaviors. Optionally, the preset on/off time parameter may be pre-stored in a storage module of the charging test apparatus, or may be obtained by using a server or the like.

Optionally, when the charging test apparatus includes a group of conductive paths, the preset on/off time parameter may include parameters corresponding to the group of conductive paths. When the charging test apparatus includes a plurality of groups of conductive paths, the preset on/off time parameter may include parameters corresponding to each group of conductive paths in the plurality of groups of conductive paths.

Optionally, the preset on/off time parameter may be a connection moment parameter of each conductive path, or may be a connection time difference parameter of each conductive path. The connection time difference parameter refers to a time difference between a connection start moment of a conductive path and a connection start moment of another conductive path. The connection moment parameter may be a connection absolute moment parameter, or may be a connection relative moment parameter. A specific type of the preset on/off time parameter is not limited in this embodiment of this application, provided that the connection start moment of each conductive path can be directly or indirectly determined.

Optionally, the connection start moment of each conductive path may be a system moment. The system moment refers to a time recorded by a timing module of the charging test apparatus.

In a specific embodiment, the preset on/off moment parameter is a connection relative start moment. By setting a connection system moment of any conductive path, system moments of other conductive paths can be determined. For example, a connection relative start moment of the first conductive path in the four conductive paths is defined as a moment 0:00:00, and correspondingly, connection relative start moments of other conductive paths are respectively a moment 0:00:01, a moment 0:00:02, and a moment 0:00:03. The connection relative start moment not only reflects a connection sequence of all the conductive paths, but also reflects a difference between connection start moments. After a system moment corresponding to a connection relative start moment of any one of the plurality of conductive paths is set, connection system moments of other conductive paths can be determined based on the connection relative start moment.

In another specific embodiment, the preset on/off moment parameter is a time difference parameter. By setting a connection system moment of any conductive path, connection system moments of other conductive paths can be determined. For example, it is assumed that a time difference between the VCC conductive path and the GND conductive path is 0 s, a time difference between the VCC conductive path and the D− conductive path is 0.5 s, and a time difference between the VCC conductive path and the D+ conductive path is 0.5 s. It can be understood that the time difference may be a positive value, or may be a negative value. A connection sequence of two conductive paths may be reflected by using a positive or negative time difference, and an absolute value of the time difference may reflect a difference between the connection start moments of two conductive paths. Therefore, after an absolute connection moment value of any one of the plurality of conductive paths is set, connection system moments of other conductive paths can be determined based on a time difference corresponding to each conductive path.

Optionally, the preset on/off time parameter may include a time parameter for implementing one connection of each conductive path, or may include a time parameter for implementing a plurality of connections of each conductive path. For ease of description, the time parameters used to control all the conductive paths to implement one connection are referred to as a time parameter group. The preset on/off time parameter may include a plurality of time parameter groups, and each time parameter group includes the time parameters of all the conductive paths. The time parameter may be the foregoing time difference parameter, or may be the foregoing connection start moment parameter.

In a specific embodiment, the preset on/off time parameter includes a connection start moment parameter for implementing a plurality of connections of each conductive path, that is, the preset on/off time parameter includes a plurality of connection time parameter groups, and each connection time parameter group includes the start moment parameters of all the conductive paths. Optionally, the plurality of connection moment parameter groups may be represented by using a matrix. For example, using an USB interface including four pins as an example, a plurality of connection moment parameter groups are represented as:

{[s11, s12, s13, s14]
[s21, s22, s23, s24]
. . .
[sn1, sn2, sn3, sn4]}

[sn1, sn2, sn3, and sn4] represent a connection moment parameter group, sn1 represents a connection moment parameter of the first conductive path, sn2 represents a connection moment parameter of the second conductive path, sn3 represents a connection moment parameter of the third conductive path, and sn4 represents a connection moment parameter of the fourth conductive path. Optionally, the first conductive path may be a GND conductive path, the second conductive path may be a D+ conductive path, the third conductive path may be a D− conductive path, and the fourth conductive path may be a VCC conductive path.

It can be understood that, in the matrix of the preset on/off time parameter, at least one connection time parameter in every two connection time parameter groups is different. A plurality of connection moment parameter groups are set, so that a plurality of conductive paths can be connected based on different connection sequences and/or different connection time differences, so as to simulate a plurality of different plugging and unplugging behaviors, thereby implementing test of the charging function of the electronic device under the plurality of plugging and unplugging behaviors, and improving comprehensiveness of the test.

In another specific embodiment, the preset on/off time parameter includes a time difference parameter for implementing a plurality of connections of each conductive path, that is, the preset on/off time parameter includes a plurality of time difference parameter groups, and each time differ-ence parameter group includes a time difference parameter between connection start moments of all the conductive paths. Optionally, the plurality of time difference parameter groups may be represented by using a parameter matrix. For example, using an USB interface including four pins as an example, a plurality of connection moment parameter groups are represented as:

{[δ11, δ12, δ13]
[δ21, δ22, δ23]
. . .
[δn1, δn2, δn3]}

[δn1, δn2, and δn3] represent a time difference parameter group, δn1 represents a time difference parameter between a connection start moment of the second conductive path and a connection start moment of the first conductive path, δn2 represents a time difference parameter between a connection start moment of the third conductive path and a connection start moment of the first conductive path, and δn3 represents a time difference parameter between a connection start moment of the fourth conductive path and a connection start moment of the first conductive path. Optionally, the first conductive path may be a GND conductive path, the second conductive path may be a D+ conductive path, the third conductive path may be a D− conductive path, and the fourth conductive path may be a VCC conductive path.

It can be understood that, in the matrix of the preset on/off time parameter, at least one time difference parameter in every two time difference parameter groups is different. The plurality of time difference parameter groups are set, so that a plurality of conductive paths can be connected based on different connection sequences and/or different connection time differences, so as to simulate different plugging and unplugging behaviors.

Optionally, a time sequence control signal for a switch in each conductive path may be generated based on a preset on/off time parameter, and turn-on/turn-off of each switch may be controlled by using the time sequence control signal, so as to implement connection and disconnection of each conductive path.

In an optional implementation, the controlling, based on the preset on/off time parameter, connection and disconnection of each conductive path in step S802 may include:

generating a time sequence control signal for each switch based on a plurality of time parameter groups; and sending the time sequence control signal to a corresponding switch to control turn-on/turn-off of each switch, so as to control connection of all the conductive paths at different connection start moments.

Figure 9:
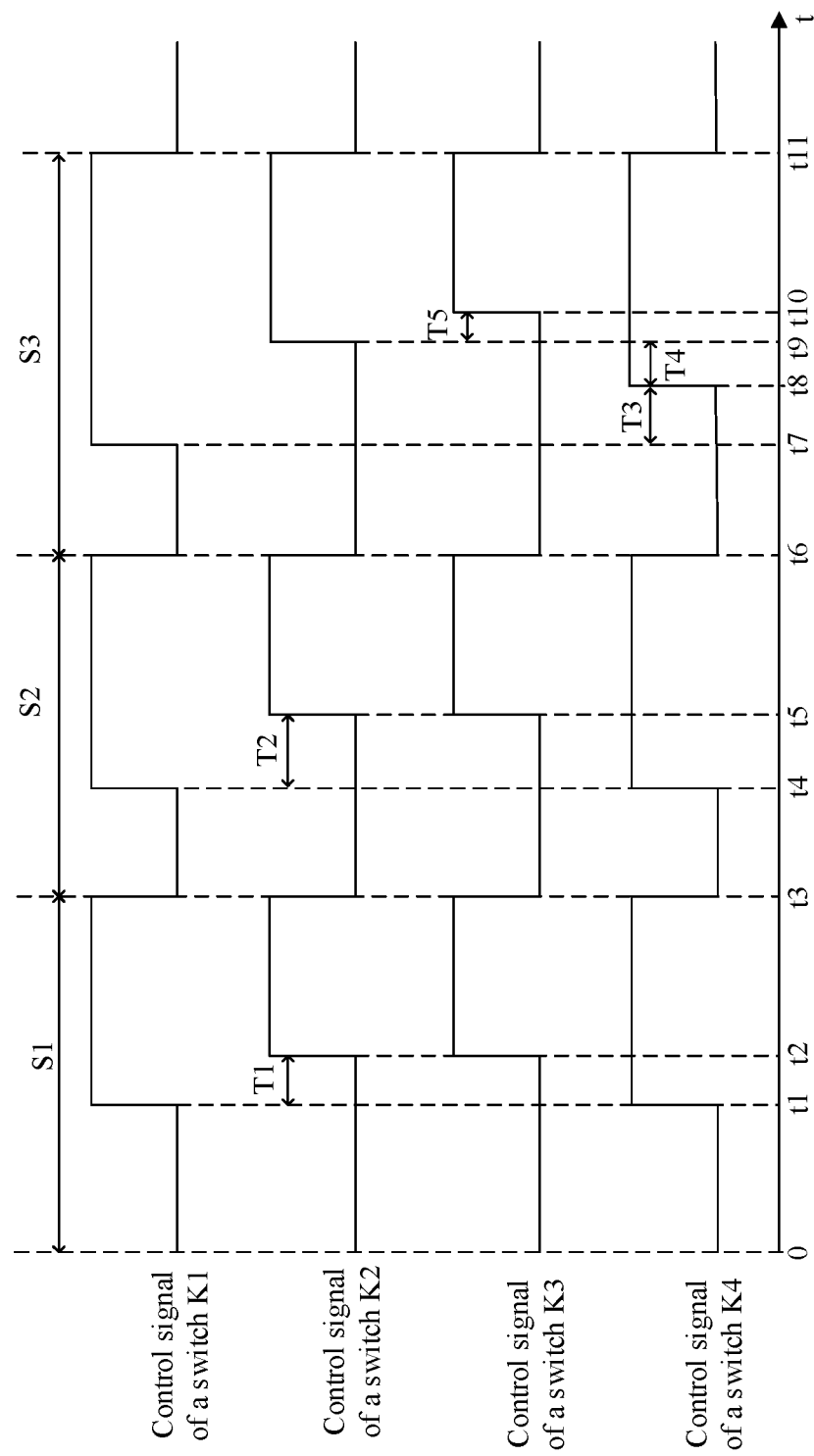
FIG. 9 is a schematic diagram of a time sequence control signal according to an embodiment of this application.

For example, FIG. 9 is a schematic diagram of a time sequence control signal (control signal for short) generated based on a plurality of time parameter groups according to an embodiment. A connection switch-K1 in the GND conductive path, a connection switch K2 in the D+ conductive path, a connection switch K3 in the D− conductive path, and a connection switch K4 in the VCC conductive path are used as an example for description. It is assumed that the switches K1-K4 turn off when the control signal is at a high level and turn on when the control signal is at a low level.

As shown in FIG. 9, in a period S1, a control signal of the switch K1 controls the switch K1 to turn on at a moment t1 and turn off at a moment t3; a control signal of the switch K2 controls the switch K2 to turn on at a moment t2 and turn off at the moment t3; a control signal of the control switch K3 controls the switch K3 to turn on at a moment t2 and turn off at the moment t3; and a control signal of the switch K4 controls the switch K4 to turn on at the moment t1 and turn off at the moment t3. In the period S1, plugging and unplugging behaviors in which the VCC conductive path and the GND conductive path are first connected, then the D− conductive path and the D+ conductive path are connected, and a difference between a connection start moment of the D− conductive path and a connection start moment of the VCC conductive path is T1 can be simulated. When T1 is small, in the period S1, quick plugging and unplugging behaviors can be simulated.

Similarly, in a period S2, plugging and unplugging behaviors in which the VCC conductive path and the GND conductive path are first connected, the D− conductive path and the D+ conductive path are then connected, and a difference between a connection start moment of the D− conductive path and a connection start moment of the VCC conductive path is T2 can be simulated. When T2 is large, in the period S2, slow plugging and unplugging behaviors can be simulated.

In a period S3, the control signal of the switch K1 controls the switch K1 to turn on at a moment t7 and turn off at a moment t11; the control signal of the switch K2 controls the switch K2 to turn on at a moment t9 and turn off at the moment t11; the control signal of the control switch K3 controls the switch K3 to turn on at a moment t10 and turn off at the moment t11; and the control signal of the switch K4 controls the switch K4 to turn on at a moment t8 and turn off at the moment t11. In the period S3, plugging and unplugging behaviors in which the GND conductive path is first connected, then the VCC conductive path is connected, then the D− conductive path and the D+ conductive path are connected, and finally the D− conductive path is connected can be simulated. In the period S3, oblique plugging and unplugging behaviors can be simulated.

According to the charging test method provided in this embodiment, the preset on/off time parameter is obtained, and connection and disconnection of each conductive path are controlled based on the preset on/off time parameter, so that various plugging and unplugging behaviors between the electronic device and the charger can be simulated, and a charging function of the electronic device can be tested. In the charging test method provided in this embodiment, the plugging and unplugging behaviors do not need to be manually performed, thereby improving efficiency of the charging test. In addition, in the charging test method provided in this embodiment, when various plugging and unplugging behaviors are simulated, connection and disconnection of the conductive path are controlled based on the preset on/off time parameter, so that test parameters and test results can be quantified, and the plugging and unplugging behaviors can be more objectively and truly simulated when compared with manually performing the plugging and unplugging behaviors, thereby making the test results more accurate.

Figure 10:
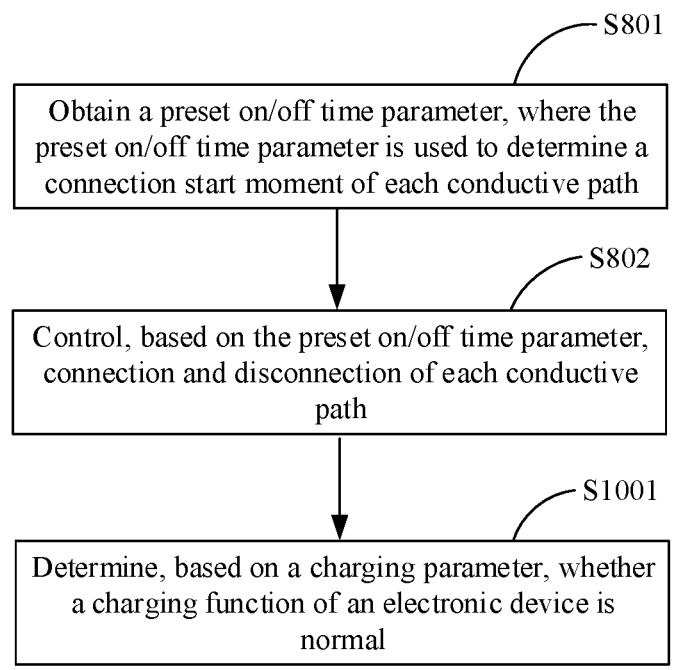
FIG. 10 is a schematic flowchart of another charging test method according to an embodiment of this application.

In an embodiment, the charging test apparatus further includes the foregoing detection module. For a specific structure, a function, and a connection relationship of the detection module, refer to the foregoing embodiment. Details are not described herein again. For example, FIG. 10 is a schematic flowchart of a charging test method according to an embodiment of this application. As shown in FIG. 10, the charging test method further includes:

S1001. Determine, based on a charging parameter, whether a charging function of an electronic device is normal.

Optionally, the charging parameter may include at least one of a charging current or a charging voltage.

Optionally, the charging current may be compared with a preset standard current, and the charging voltage may be compared with a preset standard voltage. If a difference between the charging current and the preset standard current is less than a preset current difference threshold, and a difference between the charging voltage and the preset standard voltage is less than a preset voltage difference threshold, it is determined that the charging function is normal. Otherwise, it is determined that the charging function is abnormal.

Optionally, when the charging function is abnormal, a connection start moment of each conductive path may be further recorded, so that plugging and unplugging behaviors corresponding to the abnormal charging function are subsequently analyzed based on the connection start moment, so as to facilitate analysis of a cause of the abnormal charging function of the electronic device.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A charging test apparatus, comprising:
   a first USB interface, comprising a plurality of first pins, wherein the first USB interface is configured to connect to an electronic device;
   a second USB interface, comprising a plurality of second pins, wherein the second USB interface is configured to connect to a charger, the second USB interface matches the first USB interface, and the plurality of first pins and the plurality of second pins match each other one by one to form a plurality of pin pairs;
   a plurality of conductive paths, wherein the plurality of conductive paths are electrically connected to the plurality of pin pairs in a one-to-one correspondence;
   a control module, wherein the control module is configured to control, based on a preset on/off time parameter, connection and disconnection of each conductive path, wherein the preset on/off time parameter is used to determine a connection start moment of each conductive path; and
   a detection module, wherein the detection module is electrically connected to the control module, and is configured to detect a charging parameter between the first USB interface and the second USB interface, wherein the charging parameter comprises a charging current and a charging voltage;
   wherein the control module is configured to:
      calculate a first difference between the charging current and a preset standard current;
      calculate a second difference between the charging voltage and a preset standard voltage; and
      determine whether a charging function is normal by determining whether the first difference is less than a preset current difference threshold and determining whether the second difference is less than a preset voltage difference threshold.

2. The apparatus according to claim 1, wherein connection start moments of the plurality of conductive paths are different.

3. The apparatus according to claim 1, wherein a switch is electrically connected to each conductive path, and the switch is electrically connected to the control module; and
   the control module is specifically configured to control, based on the preset on/off time parameter, turn-on/turn-off of each switch, so as to control connection and disconnection of each conductive path.

4. The apparatus according to claim 1, wherein the plurality of first pins comprise a first power supply pin, the plurality of second pins comprise a second power supply pin, and the detection module is electrically connected to a conductive path corresponding to the first power supply pin, and the detection module is specifically configured to:
  detect a current flowing through a power supply conductive path to obtain a charging current, and detect a voltage in the power supply conductive path to obtain a charging voltage.

5. The apparatus according to claim 4, wherein the detection module comprises:
  a voltage detection circuit, wherein the voltage detection circuit is electrically connected to both the power supply conductive path and the control module, and is configured to detect a voltage in the power supply conductive path to obtain the charging voltage; and
  a current detection circuit, wherein the current detection circuit is electrically connected to both the power supply conductive path and the control module, and is configured to detect a current flowing through the power supply conductive path to obtain the charging current.

6. The apparatus according to claim 5, wherein the current detection circuit comprises:
  a first detection resistor, wherein the first detection resistor is connected in series in a power supply conductive path;
  a voltage detection unit, wherein the voltage detection unit is connected in parallel to both ends of the first detection resistor, and is configured to detect a voltage at both ends of the first detection resistor; and
  a calculation unit, wherein the calculation unit is electrically connected to both the voltage detection unit and the control module, and is configured to calculate a charging current based on the voltage at both ends of the first detection resistor and a resistance value of the first detection resistor.

7. The apparatus according to claim 6, wherein the resistance value of the first detection resistor is less than 100 mohms.

8. The apparatus according to claim 4, wherein the detection module comprises:
  a second detection resistor, wherein the second detection resistor is connected in series in the power supply conductive path; and
  an analog-to-digital converter, wherein the analog-to-digital converter is electrically connected to the power supply conductive path and connected to both ends of the second detection resistor, and is configured to collect a first analog voltage signal in the power supply conductive path, and convert the first analog voltage signal into a first digital voltage signal, so as to obtain the charging voltage, and the analog-to-digital converter is further configured to collect a second analog voltage signal at both ends of the second detection resistor, and convert the second analog voltage signal into a second digital voltage signal, so as to obtain a second voltage; and
  the control module is further configured to calculate a charging current based on the second voltage and a resistance value of the second detection resistor.

9. The apparatus according to claim 8, wherein the resistance value of the second detection resistor is less than 100 mohms.

10. The apparatus according to claim 1, wherein the apparatus comprises a plurality of groups of interface modules, and each group of interface modules comprises the first USB interface, the second USB interface, and the plurality of conductive paths, and the plurality of conductive paths in each group of interface modules are electrically connected to the control module, and the control module is configured to control connection and disconnection of the plurality of conductive paths in each group of interface modules.

11. The apparatus according to claim 1, wherein the apparatus comprises a plurality of USB interface groups, and each USB interface group comprises the first USB interface and the second USB interface, and the plurality of pin pairs in each USB interface group are electrically connected to the plurality of conductive paths in a one-to-one correspondence.

12. A charging test method, applied to a charging test apparatus, wherein the charging test apparatus comprises:
  a first USB interface, a second USB interface matching the first USB interface, and a plurality of conductive paths, wherein the first USB interface is configured to connect to an electronic device and comprises a plurality of first pins, wherein the second USB interface is configured to connect to a charger and comprises a plurality of second pins, wherein the plurality of first pins and the plurality of second pins match each other one by one to form a plurality of pin pairs, and wherein the plurality of conductive paths are electrically connected to the plurality of pin pairs in a one-to-one correspondence; and
  the method comprises:
    obtaining a preset on/off time parameter, wherein the preset on/off time parameter is used to determine a connection start moment of each conductive path;
    controlling, based on the preset on/off time parameter, connection and disconnection of each conductive path;
    detecting a charging parameter between the first USB interface and the second USB interface, wherein the charging parameter comprises a charging current and a charging voltage;
    calculating a first difference between the charging current and a preset standard current;
    calculating a second difference between the charging voltage and a preset standard voltage; and
    determining whether a charging function is normal by determining whether the first difference is less than a preset current difference threshold, and determining whether the second difference is less than a preset voltage difference threshold.

13. The charging test method according to claim 12, wherein connection start moments of the plurality of conductive paths are different.

14. The charging test method according to claim 12, wherein a switch is electrically connected to each conductive path, and the switch is electrically connected to the control module; and
  the method comprises:
    controlling, based on the preset on/off time parameter, turn-on/turn-off of each switch, so as to control connection and disconnection of each conductive path.

* * * * *

UNITED STATES PATENT AND TRADEMARK OFFICE
CERTIFICATE OF CORRECTION

PATENT NO. : 12,352,828 B2
APPLICATION NO. : 17/802024
DATED : July 8, 2025
INVENTOR(S) : Longlong Meng Page 1 of 1

It is certified that error appears in the above-identified patent and that said Letters Patent is hereby corrected as shown below:

On the Title Page

In Column 2 (Other Publications), In Line 1, Delete "al. ;" and insert -- al.; --.

In Column 2 (Other Publications), In Line 2, Delete "Beiging" and insert -- Beijing --.

Signed and Sealed this
Twelfth Day of August, 2025

Coke Morgan Stewart
*Acting Director of the United States Patent and Trademark Office*